US 8,598,689 B2

(12) United States Patent
Sandhu et al.

(10) Patent No.: US 8,598,689 B2
(45) Date of Patent: Dec. 3, 2013

(54) METHODS OF MANUFACTURING SEMICONDUCTOR STRUCTURES AND DEVICES INCLUDING NANOTUBES, AND SEMICONDUCTOR STRUCTURES, DEVICES, AND SYSTEMS FABRICATED USING SUCH METHODS

(75) Inventors: Gurtej S. Sandhu, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/179,316

(22) Filed: Jul. 8, 2011

(65) Prior Publication Data

US 2011/0266694 A1     Nov. 3, 2011

Related U.S. Application Data

(62) Division of application No. 11/107,125, filed on Apr. 15, 2005, now Pat. No. 7,989,349.

(51) Int. Cl.
    *H01L 33/62*     (2010.01)
    *H01L 23/48*     (2006.01)
    *H01L 29/06*     (2006.01)
    *H01L 29/739*     (2006.01)

(52) U.S. Cl.
    CPC .................................. *H01L 29/0669* (2013.01)
    USPC ...... 257/622; 257/244; 257/E51.04; 438/700; 438/702

(58) Field of Classification Search
    USPC ......... 438/39, 41–42, 44, 439, 444, 493–494, 438/497–498, 500, 503–504, 689–759; 977/734, 742, 842, 845; 257/244, 622, 257/E51.04
    See application file for complete search history.

(56) References Cited

U.S. PATENT DOCUMENTS

| | | |
|---|---|---|
| 5,346,683 A | 9/1994 | Green et al. |
| 6,283,812 B1 | 9/2001 | Jin et al. |
| 6,322,713 B1 | 11/2001 | Choi et al. |
| 6,340,822 B1 | 1/2002 | Brown et al. |

(Continued)

FOREIGN PATENT DOCUMENTS

| | | |
|---|---|---|
| WO | 03088361 A1 | 10/2003 |
| WO | 2004033370 A1 | 4/2004 |

OTHER PUBLICATIONS

The subtleties of water in small spaces, Thomas M. Truskett, Department of Chemical Engineering and Institute for Theoretical Chemistry, University of Texas, Austin, 2003.*

(Continued)

*Primary Examiner* — Laura Menz
*Assistant Examiner* — Maliheh Malek
(74) *Attorney, Agent, or Firm* — TraskBritt

(57) ABSTRACT

A method of forming a plurality of nanotubes is disclosed. Particularly, a substrate may be provided and a plurality of recesses may be formed therein. Further, a plurality of nanotubes may be formed generally within each of the plurality of recesses and the plurality of nanotubes may be substantially surrounded with a supporting material. Additionally, at least some of the plurality of nanotubes may be selectively shortened and at least a portion of the at least some of the plurality of nanotubes may be functionalized. Methods for forming semiconductor structures intermediate structures, and semiconductor devices are disclosed. An intermediate structure, intermediate semiconductor structure, and a system including nanotube structures are also disclosed.

10 Claims, 8 Drawing Sheets

(56) References Cited

U.S. PATENT DOCUMENTS

| | | | |
|---|---|---|---|
| 6,361,861 B2 | 3/2002 | Gao et al. | |
| 6,566,704 B2* | 5/2003 | Choi et al. | 257/314 |
| 6,597,090 B1 | 7/2003 | Mancevski | |
| 6,673,392 B2 | 1/2004 | Lee et al. | |
| 6,720,728 B2 | 4/2004 | Den et al. | |
| 6,737,939 B2* | 5/2004 | Hoppe et al. | 333/186 |
| 6,903,365 B1* | 6/2005 | Nihei | 257/14 |
| 7,135,773 B2* | 11/2006 | Furukawa et al. | 257/758 |
| 7,982,318 B2* | 7/2011 | Heo et al. | 257/774 |
| 7,989,286 B2* | 8/2011 | Cheong et al. | 438/243 |
| 8,148,820 B2* | 4/2012 | Sato | 257/746 |
| 8,236,682 B2* | 8/2012 | Byun et al. | 438/626 |
| 2002/0055010 A1 | 5/2002 | Gao et al. | |
| 2002/0163079 A1* | 11/2002 | Awano | 257/750 |
| 2002/0167375 A1* | 11/2002 | Hoppe et al. | 333/186 |
| 2002/0197752 A1* | 12/2002 | Choi | 438/20 |
| 2003/0211724 A1* | 11/2003 | Haase | 438/629 |
| 2004/0058153 A1 | 3/2004 | Ren et al. | |
| 2004/0071951 A1 | 4/2004 | Jin | |
| 2004/0104660 A1* | 6/2004 | Okamoto et al. | 313/346 R |
| 2004/0137730 A1* | 7/2004 | Kim et al. | 438/689 |
| 2004/0152240 A1* | 8/2004 | Dangelo | 438/122 |
| 2004/0192152 A1* | 9/2004 | Liu et al. | 445/51 |
| 2005/0061451 A1 | 3/2005 | Busnaina et al. | |
| 2005/0127351 A1 | 6/2005 | Tolt | |
| 2005/0142385 A1 | 6/2005 | Jin | |
| 2005/0142933 A1* | 6/2005 | Beer et al. | 439/540.1 |
| 2005/0189655 A1* | 9/2005 | Furukawa et al. | 257/762 |
| 2005/0215049 A1* | 9/2005 | Horibe et al. | 438/622 |
| 2005/0221016 A1* | 10/2005 | Glatkowski et al. | 427/444 |
| 2005/0285116 A1* | 12/2005 | Wang | 257/76 |
| 2006/0011972 A1* | 1/2006 | Graham et al. | 257/324 |
| 2006/0091557 A1* | 5/2006 | Sakamoto et al. | 257/774 |
| 2006/0169972 A1* | 8/2006 | Furukawa et al. | 257/20 |
| 2006/0208362 A1* | 9/2006 | Dubin | 257/762 |
| 2006/0226551 A1* | 10/2006 | Awano | 257/773 |
| 2006/0234056 A1 | 10/2006 | Huang et al. | |
| 2006/0237708 A1* | 10/2006 | Choi et al. | 257/9 |
| 2006/0292861 A1* | 12/2006 | Furukawa et al. | 438/627 |
| 2007/0148963 A1* | 6/2007 | Chan et al. | 438/637 |
| 2007/0205450 A1* | 9/2007 | Okita | 257/296 |
| 2007/0224104 A1 | 9/2007 | Kim | |
| 2008/0142866 A1* | 6/2008 | Choi et al. | 257/309 |
| 2008/0317947 A1* | 12/2008 | Coiffic | 427/118 |
| 2009/0014705 A1* | 1/2009 | Hsu et al. | 257/3 |
| 2009/0181535 A1* | 7/2009 | Sakamoto et al. | 438/618 |
| 2011/0057322 A1* | 3/2011 | Matsunaga et al. | 257/774 |

OTHER PUBLICATIONS

Dong et al., "Length Control of Carbon Nanotubes through Nanorobotic Manipulations," IEEE, 2003, pp. 144-147.

Grobert, Nicole, "Controlled Synthesis and Nanoscale Characterization of Novel Fullerene-like Materials," Sussex Nanoscience and Nanotechnology Centre, Jul. 22, 2004, pp. 1-17.

Han et al., "Pyrolytically grown arrays of highly aligned BxCyNz nanotubes," Applied Physics Letters, vol. 78, No. 18, Apr. 30, 2001, pp. 2769-2771.

Han et al., "Synthesis of aligned BxCyNz nanotubes by a substitution-reaction route," Chemical Physics Letters 346 (2001), Oct. 12, 2001, pp. 368-372.

Hietpas, Paula, "Length Control of Carbon Nanotubes," Cornell NanoScale Facility, (date unknown), pp. 116-117.

Kyotani et al., "Formation of platinum nanorods and nanoparticles in uniform carbon nanotubes prepared by a template carbonization method," Institute for Chemical Reaction Science, Tohoku University, Jul. 2004, pp. 1-3.

Lee et al., "Growth and structure of carbon nanotubes produced by thermal chemical vapor deposition," Carbon 39, 2001, pp. 1891-1896.

Lee et al., "Growth model of bamboo-shaped carbon nanotubes by thermal chemical vapor deposition," Applied Physics Letters, vol. 77, No. 21, Nov. 20, 2000, pp. 3397-3399.

Li et al., "Electronic properties of multiwalled carbon nanotubes in an embedded vertical array," Applied Physics Letters, vol. 81, No. 5, Jul. 29, 2002, pp. 910-912.

Liu et al., "Effects of Carbon Content in Iron Catalyst Coatings on the Growth of Vertically Aligned Carbon Nanotubes on Smooth Silicon Surfaces by Thermal Chemical Vapor Deposition," Elsevier, Diamond and Related Materials, vol. 13 (2004), pp. 1274-1280.

Miyashita et al., "Selective Growth of Carbon Nanotubes for Nano Electro Mechanical Device," IEEE, 2001, pp. 301-304.

Qin et al., "Growing carbon nanotubes by microwave plasma-enhanced chemical vapor deposition," Applied Physics Letters, vol. 72, No. 26, Jun. 29, 1998, pp. 3437-3439.

Ren et al., "Growth, Characterization, and Potential Applications of Periodic Carbon Nanotube Arrays," (date unknown), (5 pages).

Tseng et al., "Monolithic Integration of Carbon Nanotube Devices with Silicon MOS Technology," Nano Letters, vol. 0, No. 0, Nov. 2003, pp. A-E.

Zhu et al., "Growth Orientation of Carbon Nanotubes by Thermal Chemical Vapor Deposition," Elsevier, Journal of Crystal Growth, vol. 234 (2002), pp. 584-588.

* cited by examiner

METHODS OF MANUFACTURING SEMICONDUCTOR STRUCTURES AND DEVICES INCLUDING NANOTUBES, AND SEMICONDUCTOR STRUCTURES, DEVICES, AND SYSTEMS FABRICATED USING SUCH METHODS

CROSS-REFERENCE TO RELATED APPLICATION

This application is a divisional of U.S. patent application Ser. No. 11/107,125, filed Apr. 15, 2005, now U.S. Pat. No. 7,989,349, issued Aug. 2, 2011, the disclosure of which is hereby incorporated herein by this reference in its entirety.

BACKGROUND

1. Field of the Invention

The present invention relates to forming a plurality of nanotubes having selective properties, and devices or systems including same. Particularly, the present invention relates to nanotube structures and methods of manufacture thereof. Further, the present invention relates to semiconductor structures and systems including nanotube structures, and methods of manufacture thereof.

2. Background of Related Art

Several efforts have been made to form nanotubes into patterned configurations (e.g., arrays), however, the resulting arrays typically include several nanotubes exhibiting irregular spacing or having varying heights. Other efforts have shown that the growth of aligned nanotubes in several directions can be controlled in a single process. Though the functional feasibility to integrate nanostructures into micro-devices has been postulated, process couplings and scale mismatches between nano- and micro-fabrication processes limit the practical production of integrated devices. It has been recognized that growing a uniform length nanotube array would be extremely difficult.

There have been few efforts regarding the handling and manufacturing of carbon nanotubes. One group has worked on the directed assembly of one-dimensional nanostructures into functional networks by fluidic assembly with a surface-patterning technique. Another research group developed a method of assembling single-walled CNTs into long ribbons and fibers. In this method the nanotubes are dispersed in a surfactant solution and then the nanotubes are condensed in the flow of a polymeric solution to form a long ribbon. Companies are selling commercial quantities of nanotubes in the form of soot, which cannot be handled effectively during the subsequent manufacturing processes. Other companies are working on flat-panel displays using carbon nanotubes as emission tips. None of these companies have reported commercially viable manufacturing solutions for the mass production of nanotubes.

One method of forming a carbon nanotube comprises taking a sheet of graphite and reducing the size of the sheet such that the sheet becomes an extremely narrow strip of material. At a width of approximately 30 nanometers, the strip curls about a lengthwise axis and the opposing carbon bonds at the side edges of the strip join to form a tube approximately 10 nanometers in diameter Thinner tubes having a diameter of between 10 nanometers and 5 nanometers can be formed in the same manner. It is also possible to produce multi-walled carbon nanotubes by curving a number of sheets of graphite (typically three to eight sheets) in a similar manner as forming a single wall carbon nanotube.

Generally, nanotubes may also be prepared by laser vaporization of a carbon target in a furnace at approximately 1200° C. A cobalt-nickel catalyst may facilitate the growth of the nanotubes because the catalyst prevents the ends of the CNTs from being "capped" during synthesis, and about 70% to 90% of the carbon target can be converted to single-walled nanotubes. While multi-wall carbon nanotubes do not need a catalyst for growth, single-walled nanotubes are preferably grown with a catalyst. Alternatively, a carbon-arc method to grow arrays of SWNTs has also been developed. In this method, ordered nanotubes are produced from ionized carbon plasma, and Joule heating from the discharge generated the plasma.

WO Patent 2004/033370 discloses method for making packets of nanostructures. More specifically, the method includes etching trenches in a silicon substrate, growing nanostructures therein. Further, the trenches are then filled with a filler material and any filler and/or nanostructure material extending beyond the trench is removed. The silicon substrate is etched away, resulting in a nanopellet surrounding the nanostructures and wherein each of the nanostructures has a generally uniform length and direction. However, such a method appears relatively limited in scope and applicability. Accordingly, improved methods for forming nanostructures and devices including same would be beneficial.

BRIEF SUMMARY

The present invention, in a number of exemplary embodiments, relates to nanotube structures and methods of manufacture thereof. The present invention further relates to semiconductor structures incorporating nanotube structures, systems including same, and methods of manufacture thereof.

One exemplary embodiment of the present invention pertains to a method of forming a plurality of nanotubes. Particularly, a substrate may be provided having a first surface and a second, opposing surface and a plurality of recesses may be formed, each having an opening at the first surface of the substrate and extending thereinto toward the second, opposing surface of the substrate. Further, a plurality of nanotubes may be formed generally within each of the plurality of recesses and the plurality of nanotubes may be substantially surrounded with a supporting material. Additionally, at least some of the plurality of nanotubes may be selectively shortened and at least a portion of the at least some of the plurality of nanotubes may be functionalized.

A further exemplary embodiment relates to a method of forming a semiconductor device. Specifically, a substrate may be provided having a first surface and a second, opposing surface and at least one recess having an opening at the first surface of the substrate and extending thereinto toward the second, opposing surface of the substrate. Also, a plurality of preformed nanotubes may be positioned generally within the at least one recess.

Yet a further exemplary embodiment of the present invention pertains to a method of forming a semiconductor structure. In further detail, a semiconductor substrate having a first surface and a second, opposing surface may be provided and a dielectric layer may be formed over at least a portion of the first surface of the semiconductor substrate. Also, at least one recess may be formed into the dielectric layer extending at least into the first surface of the semiconductor substrate and a plurality of conductive nanotubes may be formed generally within the at least one recess. Further, a conductive layer may be formed over the plurality of conductive nanotubes.

Another exemplary embodiment relates to a method of forming a semiconductor device. Specifically, a semiconductor substrate may be provided having a first surface and a second, opposing surface. Also, a dielectric layer may be formed over at least a portion of the first surface of the semiconductor substrate and at least one recess may be formed into the dielectric layer extending toward the first surface of the semiconductor substrate. A plurality of preformed nanotubes may be positioned generally within the at least one recess and affixed therein. A conductive layer may be formed over the plurality of prefomed nanotubes.

A further implementation of the present invention comprises a method of forming an intermediate structure. A wafer-scale substrate may be provided having a first surface and a second, opposing surface and a dielectric layer may be formed over at least a portion of the wafer-scale substrate. Also, at least one cavity may be formed extending into the dielectric layer toward the first surface to an intermediate surface in the dielectric layer. A plurality of conductive nanotubes may be formed extending from the intermediate surface of the at least one cavity. A dielectric material may be deposited between the plurality of conductive nanotubes and at least some of the plurality of nanotubes may be selectively shortened.

A further aspect of the present invention relates to an intermediate semiconductor structure comprising a semiconductor substrate having a first surface and a second, opposing surface. Also, the intermediate semiconductor structure may include an insulative layer formed over at least a portion of the semiconductor substrate and a plurality of recesses may extend at least partially through the insulative layer. Further, each recess of the plurality of recesses may include a plurality of nanotubes.

Additionally, a system may include a semiconductor structure according to the present invention. For instance, a system may include at least one input device and at least one output device. Also, the system may include a computing device including at least one semiconductor device. Particularly, the semiconductor device may comprise a semiconductor substrate having a first surface and a second, opposing surface and an insulative layer formed over at least a portion of the semiconductor substrate. Also, at least one recess may extend at least partially through the insulative layer and a plurality of nanotubes may be included within the at least one recess.

Other features and advantages of the present invention will become apparent to those of skill in the art through consideration of the ensuing description, the accompanying drawings, and the appended claims.

DETAILED DESCRIPTION

Generally, the present invention relates to forming nanotubes. In the following detailed description, reference is made to the accompanying drawings hereof, which illustrate specific embodiments in accordance with the present invention. It should be understood that other embodiments may be utilized, and that various structural, process, or structural and process changes may be made to the described embodiments of the present invention without departing from the spirit and scope thereof. In addition, for clarity, like numerals may refer to like elements and functions in the various figures of the drawings and illustrating the different embodiments of the present invention.

Exemplary embodiments of methods of manufacture of a plurality of nanotubes according to the present invention will be described with reference to FIGS. 1A-1F, 2A-2C, and 3A-3C.

Figure 1A:
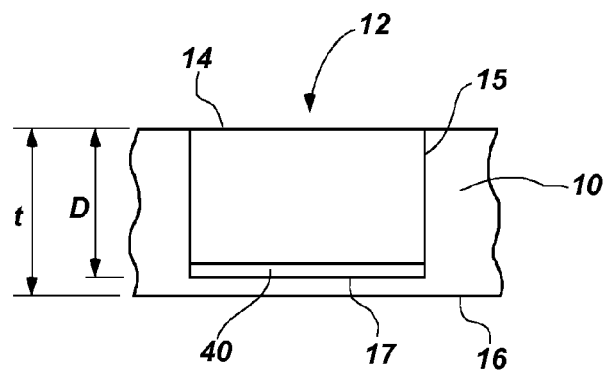
FIGS. 1A-1F illustrate, in schematic side cross-sectional views and a top elevation view of a portion of a substrate, a process for forming a plurality of nanotubes within a portion of the substrate.
Figure 1B:
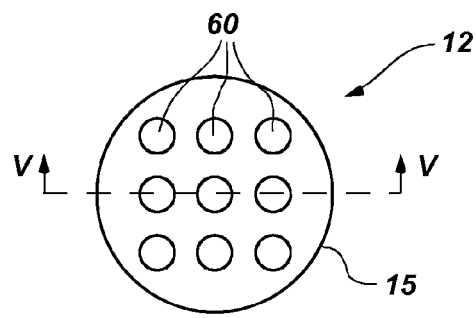

Referring to FIGS. 1B and 1A, a substrate 10 for forming nanotubes 60 (not shown in FIG. 1A for clarity) is shown in a partial top elevation view and a partial side cross-sectional view taken along reference line V-V (FIG. 1B). As discussed in further detail herein, the substrate 10 may comprise a semiconductor substrate, such as a silicon wafer. Alternatively, the substrate 10 may comprise germanium, gallium arsenide, indium phosphide, silicon-on-glass, silicon-on-sapphire, a ceramic, a polymer, a glass-filled epoxy resin material, or any other known substrate material. The substrate 10 may be rigid or flexible. Additionally, a substrate as described hereinbelow may comprise any of the above-mentioned materials or attributes, without limitation.

Generally, as described in greater detail hereinbelow, the present invention may utilize materials that are compatible with existing nanotechnology. For example and not by way of limitation, crystalline silicon, polysilicon, silicon nitride, tungsten, aluminum, aluminum doped silicon oxide ($Al_2O_3$), undoped silicon dioxide, polysilicon, and polyimide, fluorine-based acids, chlorine-based acids, and metallic hydroxides may be utilized in implementing the present invention. In addition, the present invention may generally utilize processes that are compatible with existing nanotechnology; for example and not by way of limitation, thin film deposition, oxidation, doping, lithography, chemical-mechanical polishing (CMP), etching, electroplating, chemical vapor deposition (CVD), and atomic layer deposition (ALD) may be utilized in implementing the present invention.

As shown in FIG. 1A, a blind hole or recess 12 may be formed to extend from a first surface 14 (i.e., thereinto) toward a second, opposing surface 16 of substrate 10 into substrate 10 to a depth "D," as shown in FIG. 1A. Put another way, recess 12 may extend from first surface 14 to a second surface 17 within substrate 10. Recess 12 may be formed within substrate 10 through a variety of techniques, as described below. For instance, recess 12 may be formed by removing at least a portion of the substrate 10 via an etching process. Generally, the present invention contemplates that etching processes as known in the art may be employed, such as, for instance, wet etching (anisotropic or isotropic), dry etching (generally anisotropic) or anodic (electrochemical) etching. More specifically, by way of example and not by limitation, plasma etching, ion beam etching, ion beam milling, reactive ion beam etching, chemical dry etching, chemical etching in a plasma, chemical-physical etching, or chemical wet etching may be employed for forming recess 12. Of course, the etching process and materials may be selected and tailored according to the material within which the recess 12 is to be formed (e.g., the material of substrate 10).

Generally, as known in the art, etching involves forming a resist over at least a portion of a surface to be etched. The resist may comprise a conventional positive or negative photoresist, wherein photosensitive film is coated over a surface, selectively exposed through a mask, developed photochemically to fix or cure a portion thereof, and the remainder removed. Wet etching may be commonly used for forming a desired topography in a silicon material, wherein a typical etchant may include hydrofluoric acid, ammonium fluoride, or a mixture thereof. Alternatively, a typical dry etching process may utilize fluorine atoms (e.g., generated in a discharge of nitrogen trifluoride) to etch silicon. It may be appreciated that many different etchant variations and process environments are known in the art for etching a substrate of a given material or multiple layers of materials.

Accordingly, a resist and etch process may be performed wherein a resist layer (not shown) may be formed over a portion of the first surface 14 (or second, opposing surface 16) of substrate 10 to define an exposed portion of substrate 10 surrounded by resist material and the recess 12 be etched into substrate 10.

In one embodiment, electron beam (e-beam) lithography may be employed for forming recess 12. For example, a resist layer may be formed over a substrate 10 (e.g., a silicon substrate) and an e-beam may be directed toward the resist layer over selected regions of substrate 10. Thus, recesses may be formed in resist layer by exposure to an e-beam, and a metal layer may be formed over the resist layer and within recesses, as employed in a lift-off process. For example, a Cr—Ni alloy may be evaporated over the resist layer and within recesses over substrate 10. Additionally, the resist layer may be lifted off the substrate 10 by way of a solvent (e.g., methylene chloride). Then, an anisotropic etch, such as a reactive ion etch (RIE) may be performed on the substrate 10, forming protruding features underneath regions of the deposited Cr—Ni alloy. Then, an additional etching action may be performed to remove the remaining portions deposited Cr—Ni alloy, if desired.

Subsequent to etching, the resist layer (not shown) may be removed (stripped), as known in the art. Etching recess 12 through substrate 10 may cause the sidewalls 15 defining recess 12 to exhibit a taper (not shown). Such behavior may be predictable or alterable based on the material comprising the substrate 10, its crystallographic orientation (if applicable), the thickness, labeled "t" in FIG. 1A thereof, the type of etching performed, or other characteristics that influence the process. Therefore, the dimensions of the recess 12 may be controllable, predictable, or both.

In another etching-related method for creating recess 12, a so-called atomic force lithography process may be employed wherein a resist layer is patterned by interacting with an atomic force microscopy tip. In one example, a resist layer may be patterned via locally induced electrochemical degradation proximate a contact point of a conductive atomic force microscopy tip while biasing the sample substrate positively. Other methods, as known in the art, may be utilized for patterning a resist layer via an atomic force microscopy process may be employed. Further, an etching process (e.g., anisotropic wet etching, isotropic wet etching, anisotropic dry etching, or isotropic dry etching) may be employed through the patterned resist. More specifically, by way of example and not by limitation, plasma etching, ion beam etching, ion beam milling, reactive ion beam etching, chemical dry etching, chemical etching in a plasma, chemical physical etching, or chemical wet etching may be employed for removing a portion of the substrate 10 to form recess 12. An atomic force lithography process may be advantageous for forming relatively small recesses.

More specifically, for example, recess 12 may be submicron sized. In one example, a cylindrical recess 12 may exhibit a diameter of between about 1 nanometer and 100 nanometers (0.1 µm). In further detail, the size and shape of recess 12 may be selected for facilitating growth of nanotubes therein. In further detail, the size and shape of recess 12 may be selected for promoting growth of a particular configuration or type of nanotube. For instance, a relatively tall, slender recess 12 may facilitate formation of substantially parallel nanotubes therein. Of course, other characteristics (besides geometrical) of recess 12 may be selected for promoting formation of nanotubes 60 having desirable features, as known in the art, without limitation.

Alternatively, recess 12 may be formed by way of laser ablation (i.e., exposure to directed energy in the form of a laser beam). Explaining further, as known in the art, a laser beam may be directed toward the first surface 14 of substrate 10, to ablate portions thereof to form a recess 12 having selected dimensions. In one example, recess 12 may exhibit a height of about 2 µm and a diameter (or other lateral dimension) of about 0.13 µm.

Further, the sidewalls 15 of recess 12 may exhibit a slight taper (not shown). Such characteristics may be predictable or alterable and, therefore, may be considered with respect to the dimensions of recess 12. If a laser beam is employed to form recess 12 in, for example, a silicon substrate such as a semiconductor wafer, a heat-damaged area of the substrate (commonly termed the "heat affected zone," or "HAZ") may be removed by etching using a 6% tetramethyl ammonium hydroxide (TMAH) in propylene glycol solution, which may cause a laser-ablated, rounded through-hole to tend toward a rectangular cross-section upon removal of the HAZ. Notably, the aforementioned TMAH solution does not damage any metallization which may be present on the substrate. Alternatively, a HAZ may be treated to provide a suitable site for deposition by treatment with a dilute caustic, such as 1% to 2% NaOH or KOH, solution.

Figure 1C:
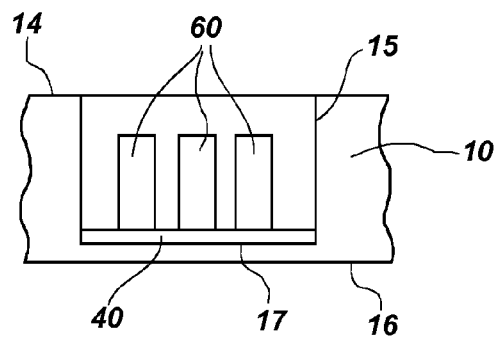

Once recess 12 is formed, as shown in FIG. 1A, an initiation layer 40 may, in one example, be formed along the bottom surface 17 of recess 12. Initiation layer 40 may be structured for promoting the formation of nanotubes thereon, as known in the art and may comprise, for instance, a metal, such as, for example, at least one of Tungsten (W), Nickel (Ni), Cobalt (Co), or Iron (Fe), and may be electrolessly plated upon surface 17, or otherwise deposited, without limitation. In lieu of formation of initiation layer 40, a suitable organic or inorganic surface treatment solution may be applied to the bottom surface 17 of recess 12 to facilitate growth of carbon or other conductive nanotubes thereon. Accordingly, as shown in FIGS. 1B and 1C, showing a schematic top elevation view and a side cross-sectional view of recess 12 (taken along reference line V-V, as shown in FIG. 1B), respectively, nanotubes 60 may be formed upon initiation layer 40 or treated surface 17 and extend therefrom toward first surface 14. Initiation layer 40 may be omitted if nanotube formation may be accomplished suitably in its absence as by appropriate surface treatment of surface 17 or otherwise. The hollow centers of nanotubes 60 have been omitted in the drawing figures, unless otherwise noted, for clarity.

Nanotubes 60 may be formed as known in the art, such as by arc discharge, laser evaporation, CVD, or a pyrolysis process. For instance, U.S. Pat. No. 6,720,728 to Den et al., the disclosure of which is incorporated in its entirety by reference herein, discloses methods of forming carbon nanotubes. Carbon nanotubes may be advantageous, because carbon nanotubes may exhibit so-called "ballistic conductivity" wherein one electron introduced into the carbon nanotube results in one electron passing therefrom and, therefore, may be exemplary electrical conductors. Alternatively, electrically conductive nanotubes according to the present invention may exhibit an electrical resistance of between about 6,000Ω to about 9,000Ω per micron of length thereof. However, the present invention contemplates that nanotubes 60 may comprise any material amenable for fabrication thereof, as known in the art, without limitation. Also, U.S. Pat. No. 6,340,822 to Brown et al., the disclosure of which is incorporated in its entirety by reference herein, discloses a method of making a circuit device including a plurality of nanowires, each of the plurality of nanowires having a substantially equal length. As another example, U.S. Pat. No. 6,673,392 to Lee et al., the disclosure of which is incorporated in its entirety by reference herein, discloses a method of vertically aligning pure carbon nanotubes on a large glass or silicon substrate via a catalytic decomposition process. In one example, a nickel catalyst layer may be deposited upon a tungsten pad or interconnect layer and a plurality of nanotubes may be grown thereon and may be substantially perpendicular or normal to the surface from which they originate, respectively, by the methods described above or as otherwise known in the art, without limitation.

Figure 1D:
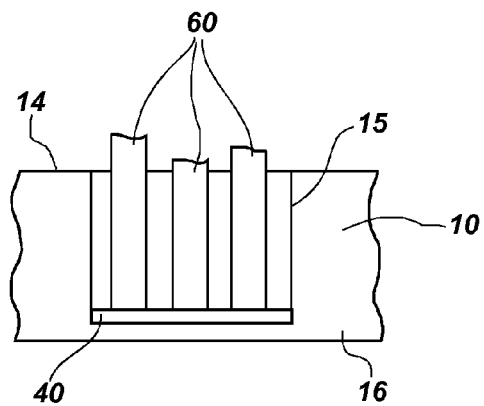

As shown in FIG. 1D, at least some of nanotubes 60 may grow sufficiently so as to extend beyond first surface 14. Put another way, a plurality of nanotubes may be formed such that at least some of the plurality of nanotubes extend beyond a surface of the recess in which formed. Accordingly, it may be desirable to fill spaces surrounding nanotubes 60 within cavity 12 with a supporting material 24 (FIG. 1E), such as a glass, a polymer, an epoxy, or another supporting material. In one embodiment, supporting material 24 may be a dielectric material for electrically insulating at least some of the nanotubes 60. Such a supporting material 24 may be desirable for supporting nanotubes 60 during subsequent processing thereof. For example, a supporting material 24 may comprise spin-on-glass, thermal oxide, PARYLENE™ polymer, low silane oxide (LSO), a pulse deposition layer comprising aluminum-rich oxide, silicon dioxide, silicon nitride, silicon oxynitride, a glass (i.e., borophosphosilicate glass, phosphosilicate glass, or borosilicate glass), or any material exhibiting suitable mechanical characteristics for supporting nanotubes. Supporting material 24 may be deposited to any desired thickness using any known process including, without limitation, physical vapor deposition (PVD), atomic layer deposition (ALD), CVD, low pressure chemical vapor deposition (LPCVD), rapid thermal nitridation (RTN), a spin-on-glass (SOG) process, flow coating or any other known process. In another example, the supporting material 24 may comprise a polymer, such as BT resin, polyimide, benzocyclobutene or polybenzoxazole deposited using an injection process, a capillary process, or a vacuum-draw process. Optionally, for instance, if nanotubes 60 are sufficiently robust (for resisting a shortening process as described hereinbelow), the supporting material 24 may be omitted.

Figure 1E:
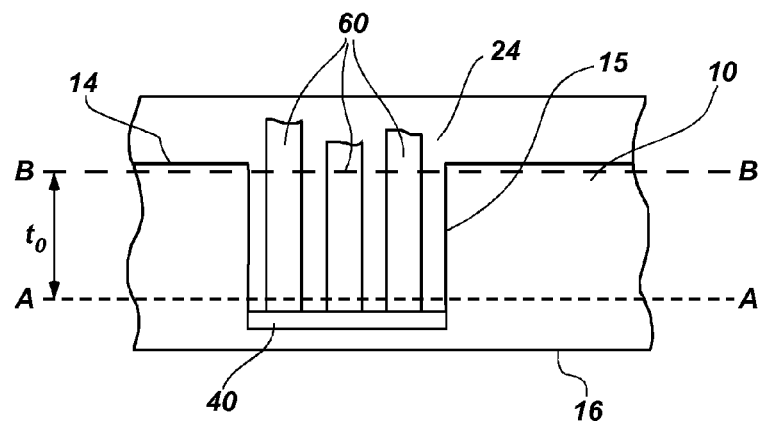
Figure 1F:
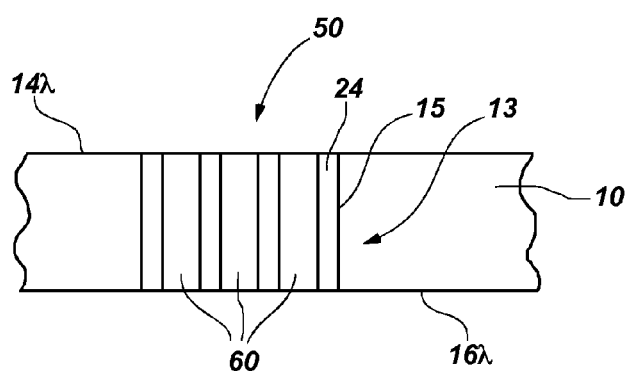

Also, at least some of the nanotubes 60 may be selectively shortened so as to exhibit a desired length. For instance, at least some of nanotubes 60 may be selectively shortened to exhibit a surface that is substantially coplanar with first surface 14 by removing supporting material 24 substantially to first surface 14. Optionally, at least a portion (including surface 14) of substrate 10 may be removed. For instance, as shown in FIG. 1F, a portion of substrate 10 may be removed forming another surface 14λ upon substrate 10. For example, a mechanical, abrasive back grind or chemical mechanical planarization (CMP) may be used to remove at least a portion of nanotubes 60 and, optionally, supporting material 24. As a further alternative, abrasive jet (water or air jet) machining or laser ablation may be used to selectively thin or remove at least a portion of nanotubes 60 and, optionally, supporting material 24. Of course, it may be desired, ultimately, to thin substrate 10 to a desired thickness $t_o$ (FIG. 1E). Accordingly, substrate 10 may be thinned from the second, opposing surface 16 to remove at least the initiation layer 40 from which the nanotubes 60 extend, as discussed in greater detail hereinbelow. Of course, the present invention contemplates that nanotubes 60 may be selectively shortened without a surrounding supporting material 24, if the nanotubes 60 exhibit sufficient durability.

Selectively shortening of at least some of the plurality of nanotubes 60 (at least one of the plurality of nanotubes 60 may be formed so as to be completely contained within the recess 12) may provide a structure wherein at least some of the plurality of nanotubes 60 exhibit a selected length or range of lengths. Of course, although nanotubes 60 are shown as extending substantially perpendicularly with respect to first surface 14, it is recognized that nanotubes 60 may be formed at an angle or otherwise meander as may naturally occur in response to the process employed for forming same. Thus, variation in at least one property (e.g., length, electrical conductivity, orientation, shape, size, etc.) of nanotubes 60 (after selective removal of at least one end thereof) may occur in relation to differences in the manner in which formation thereof occurs.

Thus, FIG. 1F shows the substrate 10 as shown in FIG. 1E where a portion of substrate 10 between first surface 14 and reference line B-B has been removed (e.g., by thinning substrate 10), as described above, and where a portion of substrate 10 between second surface 16 and reference line A-A (FIG. 1E) has been removed (e.g., by thinning substrate 10). Upon removal of the portions of the substrate 10 between the second surface 16, and reference line A-A, recess 12 becomes a through-hole 13 terminating at new, second, opposing surface 16λ. Also, upon removal of the portion of the substrate 10 between second surface 16 and reference line A-A (FIG. 1E), nanotubes 60 extending within through-hole 13 are substantially surrounded by dielectric material 24.

Thus, a plurality of conductive nanotubes 60 extending within through-hole 13 may be formed and shortened so as to exhibit substantially controlled lengths. Such a plurality of nanotubes 60 may be referred to as an assembly 50 of nanotubes 60, meaning a discrete package or packet of nanotubes formed within a larger substrate. It should be recognized that, in some embodiments, it may be preferable that each of the plurality of conductive nanotubes 60 be mechanically isolated from every other of the plurality of conductive nanotubes 60. However, it should also be appreciated that the present invention encompasses conductive via structures wherein at least some conductive nanotubes 60 of the plurality of conductive nanotubes 60 are bonded or otherwise mechanically communicate with one another.

In a further aspect of the present invention, generally, at least a portion of the plurality of nanotubes formed according to a method of the present invention may be functionalized. "Functionalized," as used herein, refers to modification (e.g., addition of a material, sizing, shaping, a chemical change, etc.) of a portion of a nanotube for a particular purpose. Functionalizing at least a portion of at least some of the plurality of nanotubes 60 may occur subsequent to forming and selectively shortening or removing (e.g., planarizing) a portion of at least one end of the plurality of nanotubes 60. Alternatively, functionalization of at least one nanotube of the plurality of nanotubes 60 may occur prior to shortening or removing a portion of at least one end of the plurality of nanotubes 60.

Figure 2A:
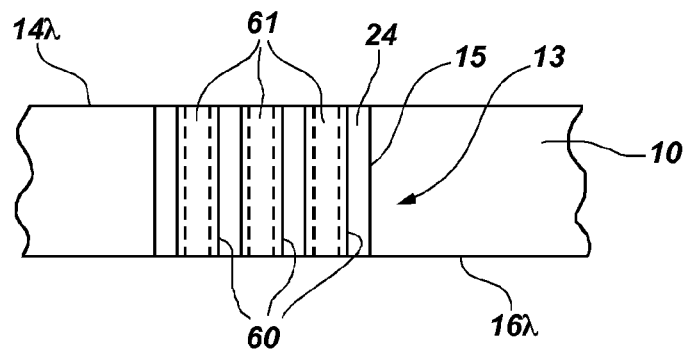
FIGS. 2A-2D illustrate, in schematic side cross-sectional views of a portion of a substrate having nanotubes formed therein, further processing of nanotubes including functionalization and protection thereof.

For example, a chemical may be applied to a portion of at least some of the plurality of nanotubes 60. More specifically, FIG. 2A shows a substrate as shown in FIG. 1F, but also illustrating a bore or interior 61 extending through nanotubes 60. Although nanotubes 60 are depicted as exhibiting a single-walled configuration, nanotubes 60 may be single or multi-walled, as known in the art, without limitation. Thus, in a first example, a chemical may be applied to at least a portion of an interior 61 of each of the plurality of nanotubes 60. At least a portion of an interior 61 of each of the plurality of nanotubes 60 may be exposed to a chemical by way of immersion of the substrate 10 into a liquid comprising the chemical, wherein the liquid is configured for exhibiting an ability to pass within an interior 61 of each of the plurality of nanotubes 60. Of course, a pressure differential may be applied between surfaces 14λ and 16λ so as to provide an impetus for a liquid (comprising the chemical) to pass at least within and possibly through an interior 61 of each of nanotubes 60.

In one example, a hydrophilic chemical may be deposited upon at least a portion of an interior 61 of each of nanotubes 60. Such a configuration may facilitate fluid transport via the plurality of nanotubes 60. Alternatively, nanotubes 60 without a coating of a hydrophilic chemical may be suitable for fluid transfer by way of capillary forces or may be otherwise configured for fluid transfer of a selected fluid, without limitation. Thus, it may be appreciated that nanotubes 60 may be configured for transporting fluid, (e.g., a water-based or water-containing fluid) from one of surfaces 14λ and 16λ to the other of surfaces 14λ and 16λ, respectively. Alternatively, if a hydrophilic chemical is deposited only upon a portion of an interior of the plurality of nanotubes 60, a water-based or water-containing fluid may be stored therein as desired. Alternatively, at least one micelle may be employed for functionalizing at least a portion of a plurality of nanotubes, which may facilitate fluid transfer therethrough.

Of course, the present invention contemplates numerous modifications and embodiments for treating at least a portion of an interior of a plurality of nanotubes. Further, the present invention contemplates that a plurality of nanotubes may be employed for transmitting or transferring a substance therethrough, such as, for instance, a gas, a fluid, or combinations thereof (including or excluding solids therein). Such transferring may be advantageous for chromatography applications.

In another alternative, at least a portion of an interior 61 of a plurality of nanotubes 60 may be substantially filled with a desired substance. For example, a medicine or drug may be placed within at least a portion of an interior of a plurality of nanotubes 60. Such a configuration may be advantageous for drug delivery applications.

Figure 2B:
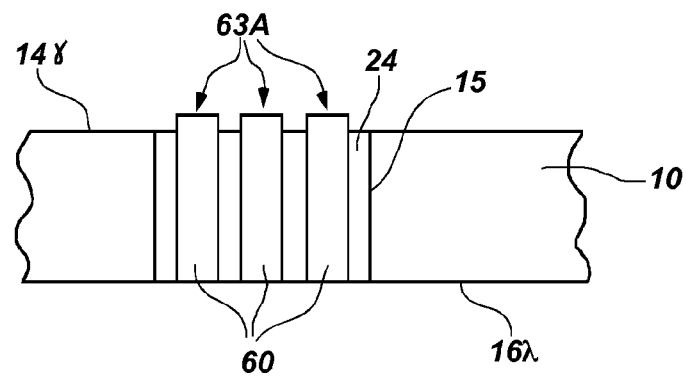
Figure 2C:
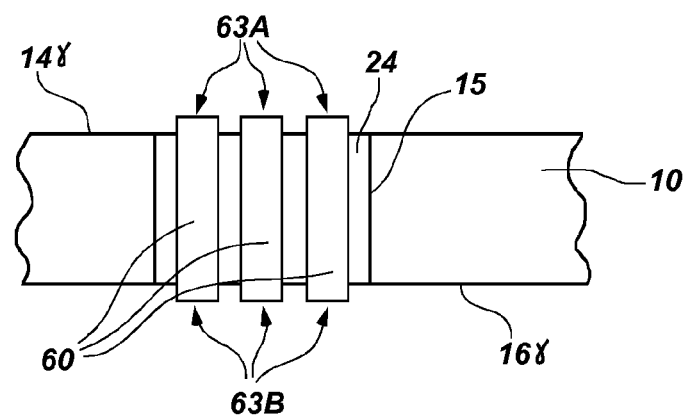

The present invention further contemplates that at least one end region of at least some of a plurality of nanotubes may be functionalized. For example, as shown in FIG. 2B (the hollow centers of nanotubes 60 have been omitted in FIG. 2B for clarity), a portion of supporting material 24 and, optionally, substrate 10, may be removed (forming surface 14γ) to allow greater access to end regions 63A of each of the plurality of nanotubes 60. Thus, similar to the discussion above relating to functionalizing at least a portion of an interior of a plurality of nanotubes, at least a portion of end regions 63A of each of a plurality of nanotubes 60 may be functionalized. Further, as shown in FIG. 2C, a portion of supporting material 24 and, optionally, substrate 10, may be removed (forming surface 16γ) to allow access to end regions 63B of each of the plurality of nanotubes 60, for functionalizing of at least a portion thereof. In addition, it should be noted that such functionalization of at least one end of a plurality of nanotubes may allow for subsequent segregation or separation of the plurality of nanotubes so functionalized from another plurality of nanotubes that have a length such that an end region thereof does not become exposed or functionalized due to removing a portion of supporting material 24, as shown in FIG. 2C.

Figure 2D:
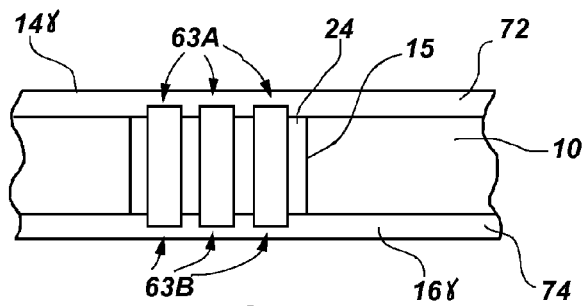

Optionally, subsequent to forming a plurality of nanotubes, and optionally functionalizing at least a portion thereof, it may be advantageous to apply a removable, protective coating for preserving the nanotubes for later use or processing. For example, FIG. 2D shows protective coating layers 72 and 74 may be formed over end regions 63A and 63B of functionalized nanotubes 60. For clarity, such protective coating layers 72 and 74 may be applied to a substrate 10 as shown in FIG. 1F (i.e., without functionalization) as may be desired. Of course, protective coating layers 72 and 74 may prevent contamination, detrimental mechanical contact, or other undesirable interactions that may occur if nanotubes 60 were exposed at one or more surface of substrate 10. Summarizing, the present invention contemplates that a selected portion (i.e., one end, both ends, a portion of an interior, a portion of an exterior, etc.) of a plurality of nanotubes may be protected, as desired and without limitation. Also, a protective material of protective coating layers 72 and 74 may be deposited in any fashion as known in the art, such as, spin coating, dipping, spraying, ALD, CVD, LPCVD, PVD, or as otherwise known in the art. Furthermore, protective coating layers 72 and 74 may be at least partially removable, (by way of, for instance, planarization, solvents, mechanical interaction, etching, etc.) so as to allow subsequent access to at least a portion of nanotubes 60.

Figure 2E:
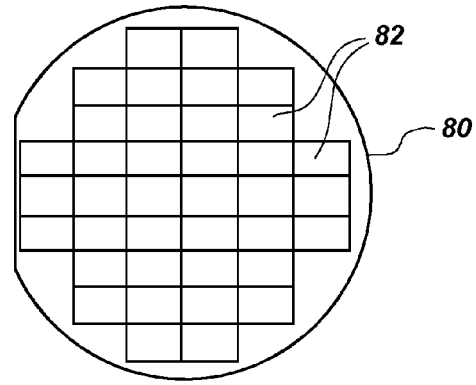
FIG. 2E shows a top elevation view of a semiconductor wafer having nanotubes therein.

In another aspect of the present invention, it may be understood that a protective layer may be applied selectively to a wafer-scale or large-scale substrate, so that nanotubes in different areas thereof may be functionalized, otherwise processed, or formed differently. For example, FIG. 2E shows a semiconductor wafer 80 having selectively defined cells or areas 82 thereof wherein nanotubes (not shown) may be formed. Further, at least one area of the plurality of areas 82 of semiconductor wafer 80 may be selectively covered with a protective coating (not shown) while another at least one area of areas 82 may be processed (e.g., functionalized, recesses formed, nanotubes formed, etc.) according to any of the actions described herein with respect to a method of the present invention. Thus, different areas 82 of a semiconductor wafer 80 may include nanotubes (not shown) that are structured or formed differently.

In a further aspect of the present invention, singulation or separation of nanotubes may be performed. Explaining further, a plurality of nanotubes formed within a blind hole may be singulated or separated from a larger substrate along with a portion thereof, apart therefrom, or individually, as may be desired.

Figure 3A:
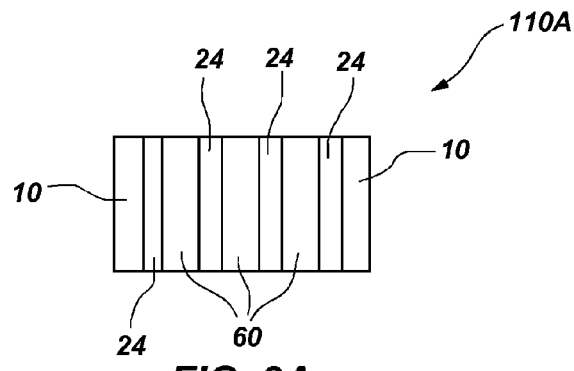
FIGS. 3A-3C show side cross-sectional views of singulated nanotube bundles and individual nanotubes.

In one embodiment, at least a portion of substrate 10 substantially surrounding an assembly of comprising a plurality of nanotubes 60 may be separated from another portion of the substrate. Thus, as shown in FIG. 3A a singulated nanotube bundle 110A may be formed. Singulated nanotube bundle 110A may be formed by laser cutting, dicing (i.e., saw cutting), or otherwise cutting the substrate 10 into discrete pieces. As mentioned above, substrate 10 may include a plurality of recesses within which nanotubes are formed; accordingly, a plurality of singulated nanotube bundles may be formed from a single substrate (e.g., a wafer). Such a process may be analogous to singulating a plurality of semiconductor dice from a semiconductor wafer.

Figures 3B, 3C:
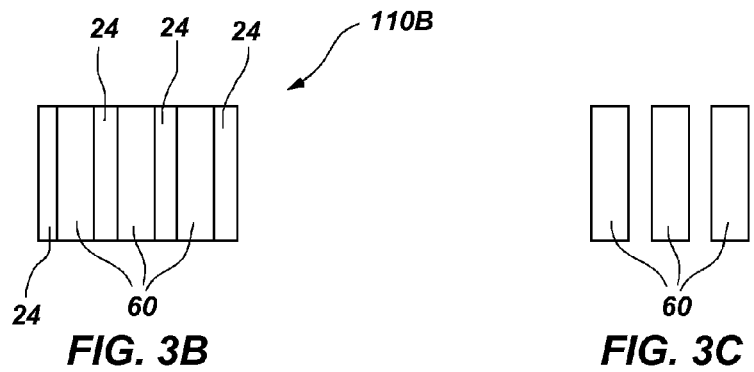

Alternatively, in another embodiment as depicted in FIG. 3B, substrate 10 may be substantially completely removed so that the supporting material 24 surrounds the assembly of nanotubes 60 to form a singulated nanotube bundle 110B. Such nanotube bundles 110A and 110B may be useful as discrete structures within semiconductor devices, or systems including same. For example, at least one singulated nanotube bundle may be useful within DRAMs, SRAMs, PCRAMs, MRAMs, CAMs, Flash memory devices, imagers, and the like. Furthermore, nanotube bundles 110A and 110B may be configured and used for different functional purposes.

The present invention further contemplates that nanotubes 60 formed within a recess 12 may be singulated or separated into multiple packets or bundles, including or excluding a portion of a substrate 10. For example, a singulated nanotube bundle 110A, as shown in FIG. 3A, may be further sectioned after formation thereof, or an assembly 50 of nanotubes 60 as shown in FIG. 1F may be sectioned into multiple pieces, as may be desirable. Thus, nanotubes formed within a recess may not necessarily remain bundled or packaged with one another.

In yet a further embodiment, each of nanotubes 60 may be substantially removed from the supporting material 24 (and substrate), as shown in FIG. 3C. For instance, supporting material 24 may be liquefied by exposure to a solvent or nanotubes 60 may be removed therefrom as otherwise known in the art. Such removed nanotubes 60 may be subsequently assembled into devices, stored, or otherwise preserved for use at a later time.

Alternatively, after forming the assembly of nanotubes 60 within supporting material 24, heat sufficient for causing oxidation of nanotubes 60 may be supplied for removing nanotubes 60 from supporting material 24 without damaging supporting material 24, leaving nano-sized holes or recesses therein. As a further alternative, nanotubes 60 may be chemically or otherwise removed from supporting material 24. Such a configuration may provide a convenient method for producing nano-sized holes through supporting material 24. Of course, an interior of a nano-sized hole may be functionalized as may be desired.

Another aspect of the present invention relates to a memory device including a plurality of electrically conductive nanotubes and methods of fabrication thereof. One embodiment relates to a plurality of electrically conductive nanotubes formed within a recess, the recess being formed in a dielectric layer lying over a substrate.

Figure 4A:
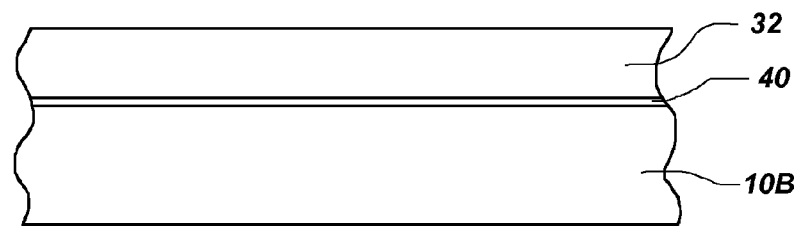
FIGS. 4A-4F illustrate methods relating to forming or placing a plurality of nanotubes within a dielectric layer.
Figure 4B:
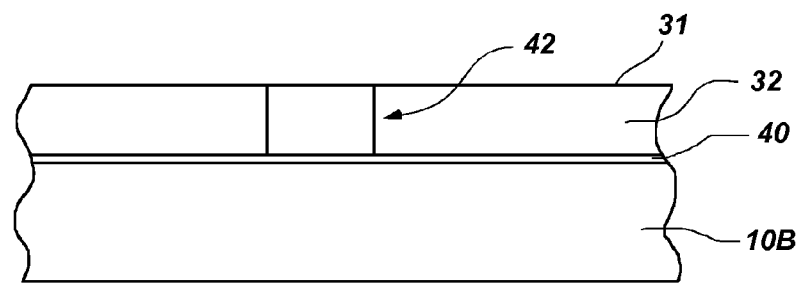
Figure 4C:
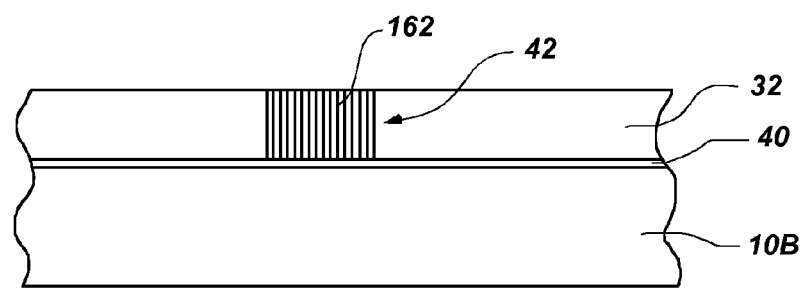

Particularly, as shown in FIG. 4A, a semiconductor substrate 10B (e.g., a semiconductor wafer) may be provided and an initiation layer 40 (if necessary for forming nanotubes thereon) or another layer for facilitating the formation of nanotubes as known in the art may be deposited over at least a portion of a surface (e.g., an active surface) of the semiconductor substrate 10B. Further, as shown in FIG. 4B, a dielectric layer 32 (see also FIG. 4A) may be formed over at least a portion of the initiation layer 40 and a recess 42 may be formed thereinto. Recess 42 may extend from surface 31 of dielectric layer 32 to a surface of the initiation layer 40. Of course, alternatively, if nanotubes may be successfully formed otherwise, initiation layer 40 may be omitted and a recess (not shown) may be formed into a dielectric layer 32 of a substrate structure extending therein or to a surface of semiconductor substrate 10B, without limitation. In another alternative, an initiation layer (not shown), if desirable, may be formed within a recess 42 (subsequent to formation thereof), upon the surface of semiconductor substrate 10B or upon a surface of the dielectric layer 32, depending upon the depth to which the recess 42 extends. Further, as shown in FIG. 4C, electrically conductive nanotubes 162 may be formed within recess 42 according to any of the methods as described above or as otherwise known in the art.

Alternatively, another embodiment relates to a plurality of electrically conductive, previously formed nanotubes positioned within a recess, the recess being formed in a dielectric layer lying over a substrate. For example, a singulated nanotube bundle (e.g., singulated nanotube bundle 110A or 110B, as shown in FIGS. 3A and 3B) including electrically conductive nanotubes may be formed by a method of the present invention, as discussed above, and may be positioned, affixed, or both positioned and affixed within a recess.

Figure 4D:
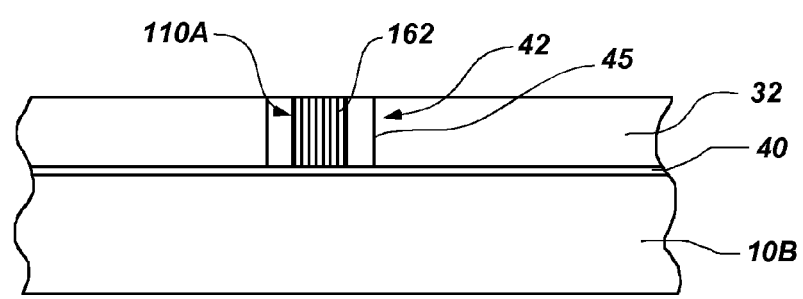
Figure 4E:
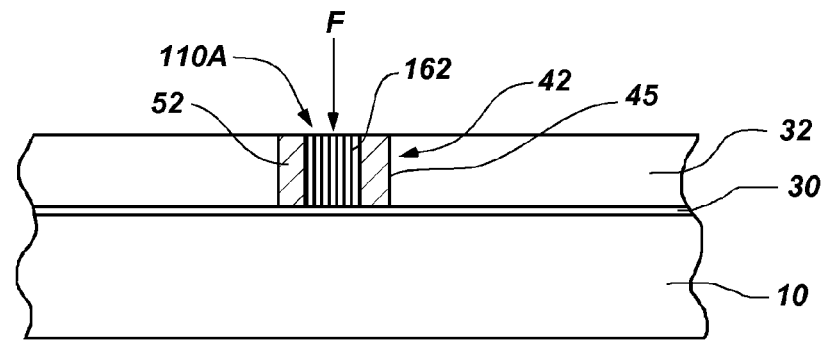

In one example, FIG. 4D shows a singulated nanotube bundle 110A placed within recess 42. Furthermore, as shown in FIG. 4E, a force "F" may be applied to singulated nanotube bundle 110A and a reinforcement material 52 may be disposed between a portion of a periphery thereof and a sidewall 45 of recess 42 and may affix nanotube bundle 110A within recess 42. Force F may be generated mechanically, magnetically, electrically, or as otherwise known in the art. Reinforcement material 52 may comprise, such as, for instance, a metal, a polymer, an encapsulant, a photopolymer, an epoxy, a glass (e.g., borophosphosilicate glass, phosphosilicate glass, borosilicate glass), a thermoplastic, and a thermoset plastic. Reinforcement material 52 may be applied, deposited, or formed at least partially within recess 42 between at least a portion of a sidewall 45 thereof and nanotube bundle 110A by, for example, spin coating, vacuum drawing, spraying, doctor blade coating, screen-printing techniques, dispensing techniques, dipping, spin-on-glass (SOG) techniques, physical vapor deposition (PVD), atomic layer deposition (ALD), chemical vapor deposition (CVD), low pressure chemical vapor deposition (LPCVD), plating, electroplating, or any other deposition techniques as known in the art. Such a configuration may provide a modular approach to forming an electrically conductive path through the dielectric layer 32.

The present invention further contemplates that a plurality of individual, electrically conductive, previously formed nanotubes may be positioned within a recess, the recess being formed in a dielectric layer lying over a substrate. Of course, it may be desirable to functionalize at least one end of each of such nanotubes, for facilitating placement of the nanotubes within a recess. For instance, nanotubes may be oriented and positioned within a recess mechanically, magnetically, electrically, or as otherwise known in the art. Explaining further, the present invention may provide methods for fabricating great numbers of nanotubes. Further, the present invention also encompasses methods for arranging or organizing vast numbers of nanotubes so fabricated. Accordingly, nanotubes may be fabricated so as to facilitate arrangement thereof or organization thereof.

For example, functionalizing at least a portion of a plurality of nanotubes with a magnetic or electrically responsive material may allow for organization of the plurality of nanotubes in response to exposure to an electric or magnetic field.

Thus, nanotubes may be organized by way of exposure to a magnetic or electric field. More specifically, for instance, a so-called electrophoretic bath may be utilized for organizing a plurality of functionalized nanotubes. Such an electrophoretic bath solution may comprise any suitable fluid with nanotubes suspended therein. As known in the art, a deposition substrate may be placed within the electrophoretic bath and an electric potential may be applied between a selected deposition surface and an electrode. Further, nanotubes, if necessary, may be functionalized so as to exhibit (electric charge) polarization within an electric field. Of course, other methods of organization of a plurality of nanotubes are contemplated by the present invention, including biological organization or other methods as known in the art.

Figure 4F:
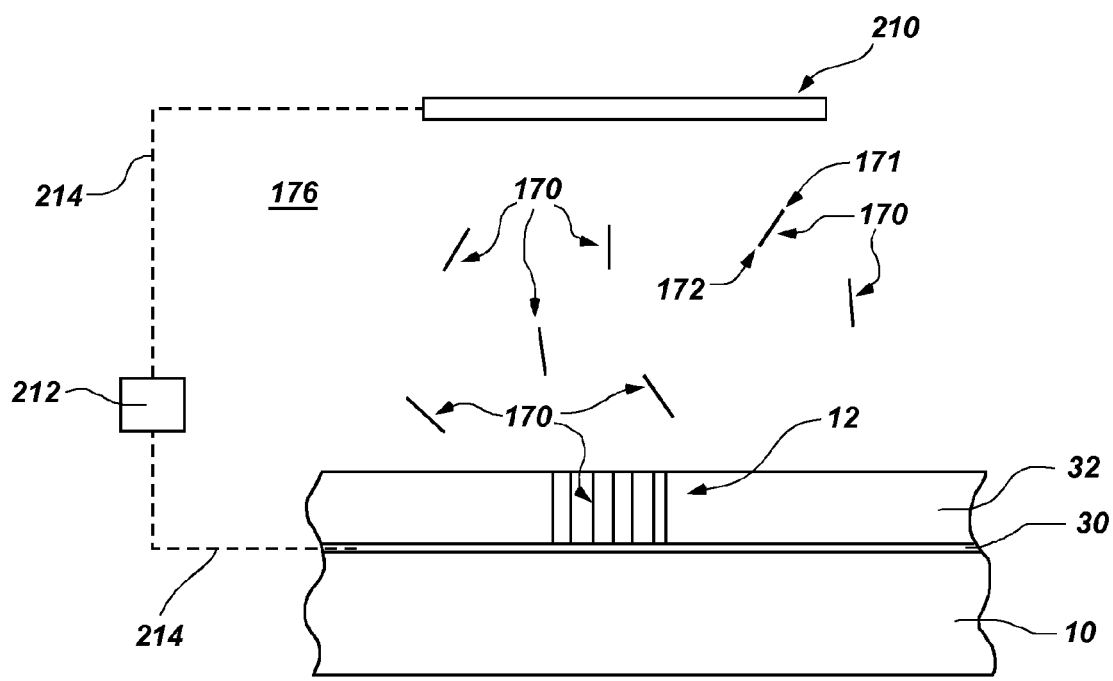

FIG. 4F illustrates an electrophoretic method by which individual nanotubes 170 (preferably having at least one functionalized end 171 and, optionally, another functionalized end 172) may be oriented and positioned within recess 12 by way of electrophoretic impetus. More specifically, initiation layer 30 may be attached to an electrical source 212 configured for producing an electrical potential between electrode 210 and initiation layer 30 via appropriate electrical connections as shown in broken lines 214. Further, a bath 176 environment (e.g., a liquid or gas) may be provided for facilitating movement of nanotubes 170 therein. Thus, an electric field may be formed between electrode 210 and initiation layer 30 which influences (e.g., by way of a force) at least some of nanotubes 170 within bath 176 to become positioned within recess 12. Nanotubes 170 may be affixed within recess 12 by deposition of a reinforcement material or, alternatively, bath 176 may include a reinforcement material that hardens or cures so as to affix nanotubes 170 within recess 12. Such affixation may abut nanotubes 170 against initiation layer 30 so as to form an electrical connection therebetween. In one example, a dielectric material may be deposited between recess 12 and nanotubes 170. In another example, a conductive epoxy or paste may be deposited proximate initiation layer 30 for forming an electrical connection between nanotubes 170 and initiation layer 30 and affixing nanotubes 170 within recess 12. Similarly, it should be further appreciated that a nanotube bundle (not shown) may be configured for orientation and positioning within and affixation to a recess and electrical coupling to initiation layer 30.

Figure 4G:
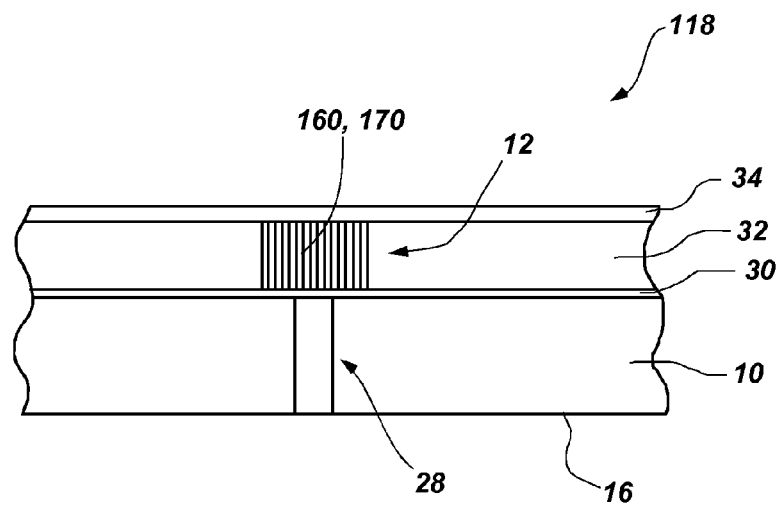
FIG. 4G shows a schematic side cross-sectional view of an intermediate structure including a plurality of nanotubes.
Figure 4H:
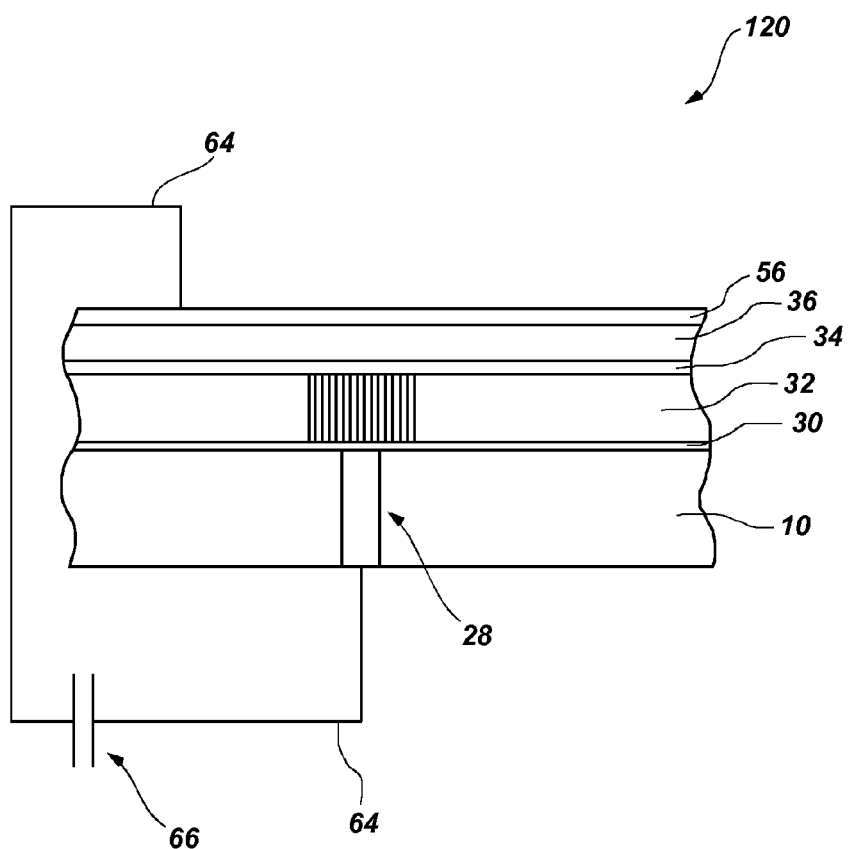
FIG. 4H shows a schematic side cross-sectional view of a memory device including a plurality of nanotubes.

Further, subsequent to formation or placement of nanotubes 160, 170 or a nanotube bundle (not shown) within recess 12, a conductive layer 34 (e.g., a metal layer) may be formed over dielectric layer 32, the conductive layer 34 in electrical communication with nanotubes 160, 170 or the nanotube bundle (not shown) within recess 12. In addition, as shown in FIG. 4G, a conductive via 28 may be formed through substrate 10 between surface 16 thereof and initiation layer 30, so as to electrically communicate with nanotubes 160, 170 positioned within recess 12. Such an intermediate structure 118 may be useful in many semiconductor environments and devices. For example, as shown in FIG. 4H, a memory device 120 may be formed wherein a dielectric layer 36 may be formed over conductive layer 34, another conductive layer 56 may be formed over dielectric layer 36, and electrical conduits 64 may be coupled to conductive via 28 and conductive layer 56 by way of an intervening capacitor 66. Such a configuration may be useful in electronics or other devices utilizing memory devices.

Figure 5:
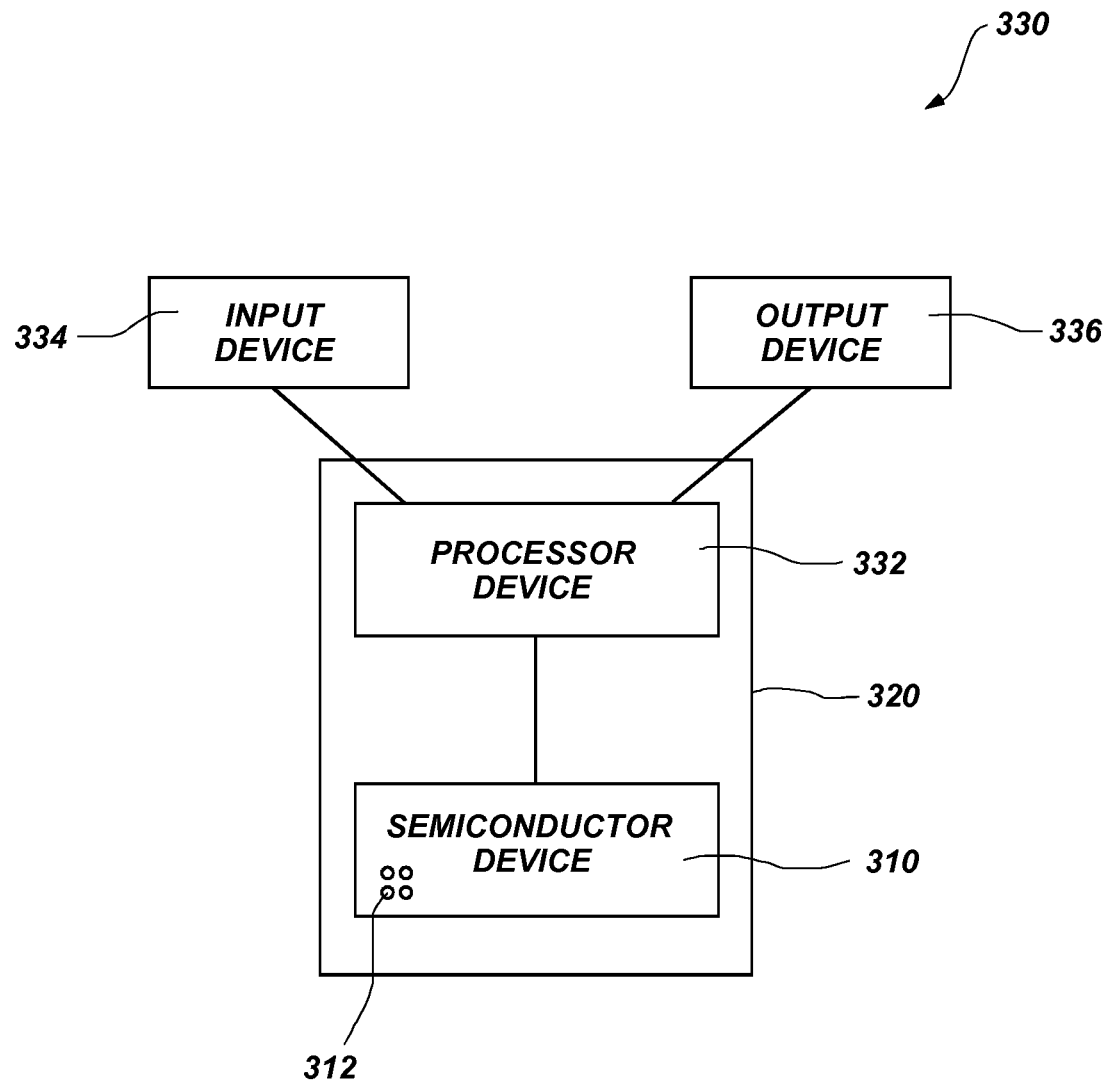
FIG. 5 is a schematic block diagram of a system according to the present invention.

More generally, it is further noted that the above-described nanotubes, nanotube bundles, or memory devices according to the present invention may be utilized in a computer or other electronic component environment. For example, FIG. 5 shows a schematic block diagram of system 330 according to the present invention. Semiconductor device 310 may be included in a computing device 320, such as a hand-held computing device, a computer, or another electronic device. The computing device 320 may include a processor device 332, such as a central processing unit or other logic device operably coupled thereto. Semiconductor device 310 may include at least one semiconductor die 312 including at least one nanotube formed or configured according to the present invention as described above. Further, processor device 332 may also be coupled with one or more appropriate input devices 334 (e.g., mouse, push-button, touch screen, communication interface, hard drive, etc.) and one or more output devices 336 (e.g., a display, printer, communication interface, hard drive, etc.) within system 330. It is also noted that the semiconductor device 310 may be utilized in various computing environments, systems, and devices, such as, for example, cell phones, personal data assistants (PDAs), chromatography equipment, and other electronic devices.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A semiconductor structure, comprising:
 a semiconductor substrate having a first surface and a second, opposing surface;
 a dielectric layer formed over at least a portion of the first surface of the semiconductor substrate;
 at least one recess extending through the dielectric layer and into the first surface of the semiconductor substrate;
 a plurality of conductive nanotubes disposed within the at least one recess;
 a volume of supporting material surrounding the plurality of conductive nanotubes and filling spaces between conductive nanotubes of the plurality of conductive nanotubes within the at least one recess;
 a portion of a nanotube formation substrate material disposed about a periphery of the supporting material within the at least one recess; and
 a conductive layer formed over the plurality of conductive nanotubes.

2. The semiconductor structure of claim 1, wherein the plurality of conductive nanotubes extends to a planar surface of the dielectric layer.

3. The semiconductor structure of claim 1, further comprising a conductive via extending from the second, opposing surface of the semiconductor substrate to the first surface of the semiconductor substrate, the conductive via being in electrical communication with at least some of the plurality of conductive nanotubes.

4. The semiconductor structure of claim 1, wherein at least some of the plurality of conductive nanotubes are configured for conducting fluid therethrough.

5. The semiconductor structure of claim 1, wherein the plurality of conductive nanotubes, the volume of supporting material, and the portion of the nanotube formation substrate material within the at least one recess comprise a singulated nanotube bundle comprising at least two nanotubes formed with and removed from a larger plurality of nanotubes.

6. The semiconductor structure of claim 5, further comprising a reinforcement material deposited between a periphery of the singulated nanotube bundle and a side wall of the at least one recess, wherein the reinforcement material affixes the singulated nanotube bundle within the at least one recess.

7. A system, comprising:
 at least one input device;
 at least one output device; and
 a computing device including at least one semiconductor device, comprising:

a semiconductor substrate having a first surface and a second, opposing surface;
an insulative layer formed over at least a portion of the semiconductor substrate;
at least one recess extending at least partially through the insulative layer;
a plurality of nanotubes within the at least one recess, wherein the plurality of nanotubes comprises a singulated nanotube bundle comprising at least two nanotubes formed with and removed from a larger plurality of nanotubes, wherein the singulated nanotube bundle further comprises:
a volume of supporting material surrounding the at least two nanotubes and filling spaces between the at least two nanotubes; and
a portion of a nanotube formation substrate material disposed about a periphery of the supporting material; and
a reinforcement material deposited between a periphery of the singulated nanotube bundle and a side wall of the at least one recess, wherein the reinforcement material affixes the singulated nanotube bundle within the at least one recess.

8. The system of claim 7, wherein the plurality of nanotubes extends to a planar surface of the insulative layer.

9. The system of claim 7, further comprising a conductive via extending from the second, opposing surface of the semiconductor substrate to at least some of the plurality of nanotubes in the at least one recess and in electrical communication therewith.

10. The system of claim 7, wherein at least some of the plurality of nanotubes are configured for conducting fluid therethrough.

* * * * *